United States Patent [19]
Ebihara

[11] Patent Number: 5,726,542
[45] Date of Patent: Mar. 10, 1998

[54] STAGE APPARATUS

[75] Inventor: Akimitsu Ebihara, Kanagawa-ken, Japan

[73] Assignee: Nikon Corporation, Tokyo, Japan

[21] Appl. No.: 416,454

[22] Filed: Apr. 3, 1995

Related U.S. Application Data

[63] Continuation of Ser. No. 282,223, Jul. 29, 1994, abandoned, which is a continuation of Ser. No. 150,275, Nov. 10, 1993, abandoned, which is a continuation of Ser. No. 55,956, Apr. 30, 1993, which is a continuation of Ser. No. 877,273, Apr. 29, 1992, abandoned, which is a continuation of Ser. No. 663,367, Mar. 1, 1991, abandoned.

[30] Foreign Application Priority Data

Mar. 5, 1990 [JP] Japan ................. 2-051905
Nov. 20, 1990 [JP] Japan ................. 2-312812

[51] Int. Cl.⁶ .................................................. H02K 33/00
[52] U.S. Cl. ........................... 318/35; 318/51; 318/135; 318/649; 318/687; 318/685
[58] Field of Search ................. 318/34–87, 135, 318/652, 649, 671, 687, 638, 648, 645, 696

[56] References Cited

U.S. PATENT DOCUMENTS

| | | | |
|---|---|---|---|
| 3,775,656 | 11/1973 | Roman | 318/649 |
| 4,149,118 | 4/1979 | Winterling et al. | 318/649 X |
| 4,447,770 | 5/1984 | Shepard | 318/649 X |
| 4,507,598 | 3/1985 | Wakabayashi et al. | 318/38 |
| 4,698,575 | 10/1987 | Bouwer | 318/135 |
| 4,704,712 | 11/1987 | Siryi | 369/249 |
| 4,714,400 | 12/1987 | Barnett et al. | 318/38 |
| 4,742,286 | 5/1988 | Phillips | 318/640 X |
| 4,774,442 | 9/1988 | Teramachi | 318/135 |
| 4,808,892 | 2/1989 | Dreibelbis | 318/135 |
| 4,812,725 | 3/1989 | Chitayat | 318/625 |
| 4,834,353 | 5/1989 | Chitayat | 318/3 D |
| 5,296,988 | 3/1994 | Fujino | 360/110 |

*Primary Examiner*—David S. Martin
*Attorney, Agent, or Firm*—Michael N. Meller

[57] ABSTRACT

Position apparatus for controlling the movement of a table, on which a semiconductor work is carried along a unidirectional path in rectangular coordinate system. The table is driven in a single plane by x and y coordinate drive control means. The position apparatus includes guide means for supporting the table on the base; first drive means for driving the table in a first direction, a second drive means for driving the table in a second direction opposite to the first direction and controller means for controlling the first and second drive means to cause the table to stop without causing table vibration and without overshoot.

11 Claims, 7 Drawing Sheets

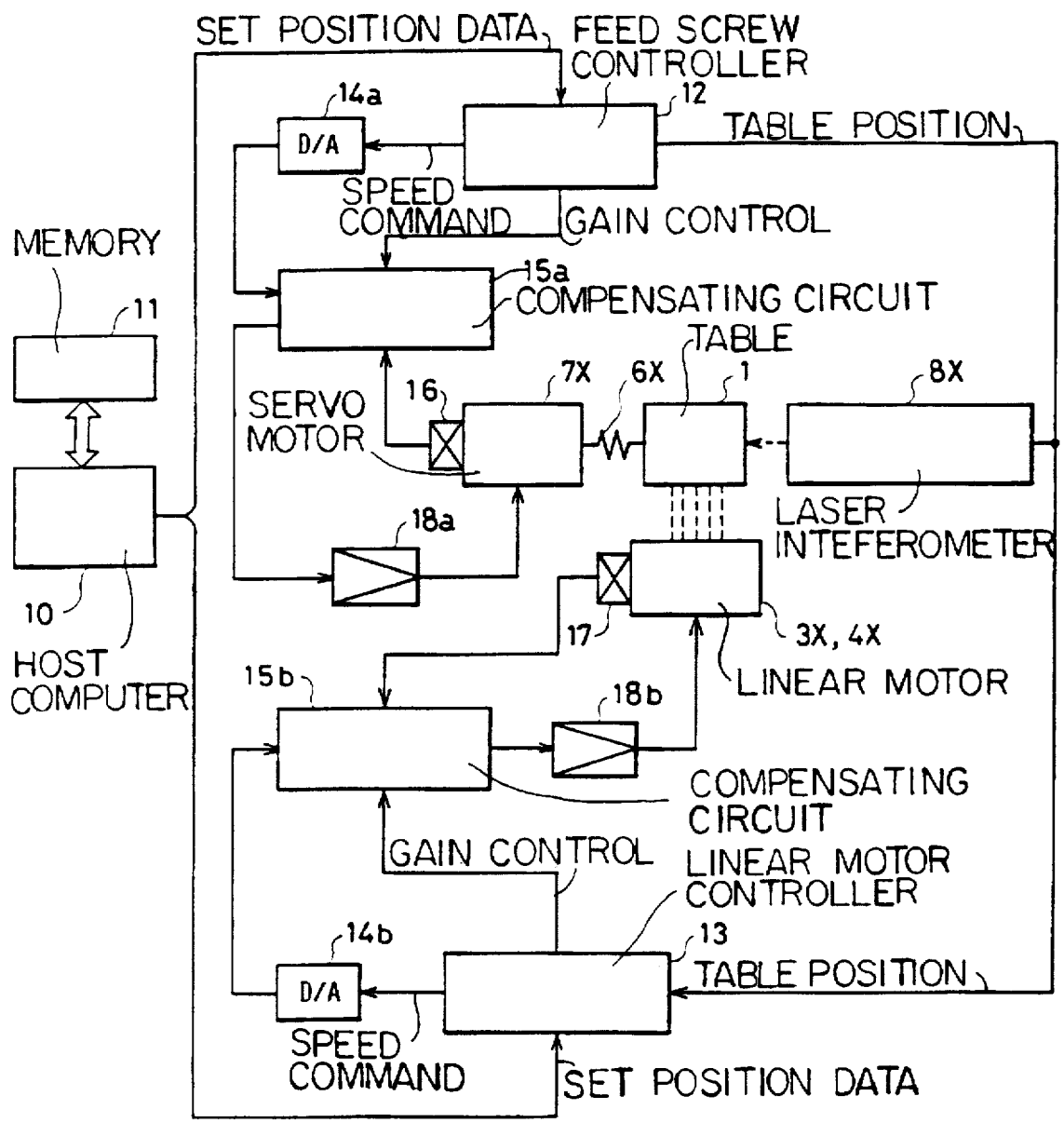
F I G. 3

STAGE APPARATUS

This application is a continuation of application Ser. No. 08/282,223, filed Jul. 29, 1994, abandoned, which is a continuation of application Ser. No. 055,956, filed Apr. 30, 1993, pending, which is a continuation of application Ser. No. 877,273, filed Apr. 29, 1992, abandoned, which is a continuation of application Ser. No. 663,367, filed Mar. 1, 1991, now abandoned.

BACKGROUND OF THE INVENTION

1. Field of the Invention

This invention relates generally to a stage apparatus, and more particularly to a stage apparatus for controlling the movement of a table on which a work of a semiconductor producing equipment or a precision working machine or a specimen to be measured by a precision measuring instrument is carried.

2. Description of the Prior Art

High efficiency and high precision is required for a stage apparatus employed for semiconductor producing such as light exposing apparatus, precision measuring instruments employing a laser beam or precision working machines, to control the movement of a table on which a work or a specimen (hereinafter referred to only as work) such as a semiconductor wafer is carried to position and stop the table at a predetermined position. A stage apparatus of this type includes a work support and guide mechanism to support and guide a table and a driving mechanism to the drive table. The stage apparatus has a serious vibration problem resulting from stopping of the table (upon deceleration) which deteriorates the positioning efficiency (that is, the period of time required before a stopped condition is reached) and the accuracy (positioning accuracy with respect to an aimed stopping position). Therefore, improvement in vibration control and the system dynamic characteristic is demanded.

Referring to FIG. 7 which schematically shows an exemplary conventional stage apparatus, including a table 20 for receiving a work thereon which is supported and guided for linear movement in a leftward or rightward direction (hereinafter referred to as X direction) in FIG. 7 by a guide mechanism 21 composed of an arrangement of a plurality of needle bearings, and is driven by a motor 24 by way of a feed screw 23 which extends in parallel to the passage provided by the guide mechanism 21. A coordinate axis x for driving the table 20 is formed on a base 22, and a current position x of the table 20 on the coordinate axis x is measured precisely by a laser interferometer 25 on the base 22 and a reflector (flat mirror) 26 provided at an end portion of the table 20. A controller 27 controls operation of the motor 24 so that the table 20 is fed to an aimed stopping position $x_0$ for the table 20 prescribed on the coordinate x in accordance with a result of measurement by the laser interferometer 25 such that it is first accelerated and then moved at a uniform speed whereafter it is decelerated until the current position x measured by the interferometer 25 coincides with the position $x_0$. The table 20 is positioned with respect to the base 22 in this manner.

The resilient force of the feed screw 23 and the force exerted by the guide mechanism 21, produce vibrations on the table 20 by a force of inertia caused upon deceleration and stopping of the table 20. Accordingly, until after such vibrations are attenuated or until the table 20 is stopped completely after stopping of the motor 24, the next operation cannot be started and the waiting time for such attenuation deteriorates the efficiency in positioning operation.

Thus, in such conventional apparatus as described above, the mass of a movable part (table 20) is designed small so as to reduce the vibration energy of the vibration system while a lubricant having a high viscosity is employed for the guide mechanism 21 in order to cause quick attenuation of vibrations.

It should be further understood that the feed screw 23 cannot be regarded as a rigid body and a play exists at every joining portion or contacting portion, and consequently, an attenuating force of lubricating oil and unnecessary frictional force exist. Therefore, stopping time of the motor 24 does not coincide with the stopping time of the table 20. Consequently, the actual stopping position $x_1$ of the table 20 does not coincide with the aimed position $x_0$, and the positioning accuracy is deteriorated by the presence of a difference $\Delta x$ between them.

Thus, the rigidity of the feed screw 23 in a conventional stage apparatus is generally designed high with the play viscous force and frictional force at every joining portion or contacting portion designed small so as to improve the response of the table 20 to the motor 24.

If the response of the table 20 to the motor 24 is raised in order to reduce the difference $\Delta x$ as described above, then the attenuating force for vibrations produced upon stopping of the table 20 becomes short, and consequently, another problem develops in that the attenuation waiting time is extended. Or on the contrary if precedence is given to the problem of attenuation of vibrations, then the response of the table 20 to the motor 24 deteriorates, and consequently, the position difference $\Delta x$ upon stopping of the table 20 is increased. Accordingly, due to the progressively increasing demand for improvement in both the efficiency and accuracy in positioning, the prior art has an inherent problem.

An attempt has been made to minimize vibrations upon stopping of the table 20 by controlling the motor 24 to optimize the deceleration curve of the table obtained by taking the attenuating force of the guide mechanism 21 into consideration. However, since the needle bearings employed for the guide mechanism 21 include differences in working error or lubricating condition among individual products or over the overall length, the attenuating forces provided by the bearings present such a large dispersion that precise numeric conversion or normalization cannot be achieved and also actual effects lack in reproducibility.

Additional stage apparatus has been proposed wherein a needle bearing or a drive shaft is not employed and instead the table is supported in a non-contacting relationship by means of an air bearing and is driven by a linear motor provided between a base and the table. With such stage apparatus the table is floating in the air so that the actual behavior of the table coincides with a high degree of accuracy with a table deceleration curve. However, such apparatus does not provide sufficient thrust and, since a mechanical vibration attenuating force including a frictional force does not act at all, it is unstable and lacks in fixed position holding faculty such that fine vibrations continue for a long period of time.

On the other hand, to calibrate a difference $\Delta x$ that may exist when the table is stopped, the table is constructed from two parts with one part having a nut engaging a feed screw and the other a main part. A fine feeding device such as a piezo-electric element is installed between the two parts of the table. When the feed screw stops moving the fine feeding device fine feeds the main part of the table to correct the difference $\Delta x$. This arrangement, complicates the structure of the table and increases its weight. Moreover, with this arrangement, the structure is susceptible to increased vibration and the attenuating time is elongated which complicates the calibration procedure. With the arrangement, however, the entire table is complicated in structure and increased in weight. Accordingly, the arrangement has such drawbacks that the vibration energy is increased, that the attenuating time is elongated and the controlling procedure is complicated.

SUMMARY OF THE INVENTION

It is a principal object of the present invention to solve such contradictory problems as described above, or in other words, to provide a stage apparatus wherein vibrations of a table upon stopping are minimized without deteriorating the responsibility of the table to a driving shaft for the table for a period of time until the table is stopped to improve both the efficiency and accuracy in positioning.

It is another object of the present invention to provide a stage apparatus which can offset a small displacement remaining with a table after stopping without provision of a special additional mechanism or member.

In accordance with one aspect of the present invention a stage apparatus for feeding a table on a base by way of driving shaft means to effect positioning of the table comprises guide means for guiding and supporting the table on the base; linear motor means provided between the base and the table along a direction in which the table is fed; and controlling means for controlling, for a predetermined period before the table is stopped, stopping operations of the driving shaft means and the linear motor means in a mutually associated relationship in accordance with predetermined controlling conditions.

In accordance with another aspect of the present invention, the stage apparatus comprises: a table; a base and guide mechanism for supporting movement of said table in a first direction; a first driving mechanism on said base for driving said table, said first driving mechanism including a driving shaft aligned in said first direction and being affixed to said table; a second driving mechanism comprising a movable element fixed with respect to said table and having at least one stator mounted on said base facing said movable element in parallel alignment with said first direction wherein said second driving mechanism operates by the magnetic force from said stator on said movable element; and a control device comprising at least a first operating mode for driving said table under the control of said first driving mechanism and a second operating mode for stopping the movement of said table under the control of said first driving mechanism and said second driving mechanism.

In accordance with a further aspect of the present invention the stage apparatus further comprises: a first controller for controlling the movement of said table through said first driving mechanism; a second controller for controlling the movement of said table through said second driving mechanism via said movable element; and a main controller to correlate the operations of said first controller and said second controller.

Also in the stage apparatus of the present invention, the table is moved on the base by way of the driving shaft similarly as in the conventional stage apparatus described above. Further, positioning of the table is executed such that the stopping position thereof may coincide with a predetermined aimed position. Furthermore, the table in a stopping condition is held in position stably with respect to the base by the driving shaft.

In the stage apparatus of the present invention, the linear motor means is provided in addition to the driving shaft and the guide means. The linear motor means offsets, suppresses or attenuates a vibration producing force which is produced from a resiliency of the driving shaft during a table decelerating period, thereby to reduce the vibration energy upon stopping of the table. In particular, while a passive attenuating force is exerted, with the conventional stage apparatus, against a vibration producing force which is produced on the driving shaft (such passive attenuating force is much smaller than the vibration producing force), with the stage apparatus of the present invention, a dynamic and active prescribed attenuating force is exerted by the linear motor means. Thus, where the guide means is not of the contacting type such as a needle bearing but of the non-contacting type such as an air bearing, a possible influence of the guide means upon motion of the table is eliminated, and forces acting upon the table are simplified to those from the driving shaft which can be electrically and numerically controlled readily and those from the linear motor means which can be controlled readily with a high degree of accuracy and in a high responsibility. Consequently, the reproducibility of control is improved.

The present invention can be realized even where the guide means employed is of the contacting type. However, such guide means of the contacting type involves an unstable friction which causes the table to be stopped at a displaced position, and in order to reduce such displacement, it is necessary to increase the driving force for the table. Where the guide means employs an ordinary anti-friction bearing such as, for example, a needle bearing, since the viscosity thereof is very low, an increase of the driving force will make the table vibratory, and as a result, a phenomenon similar to that which takes place where guide means of the non-contacting type is employed takes place. Accordingly, also in a stage apparatus which adopts guide means of the non-contacting type such as a needle bearing, an effective decelerating program which controls the driving shaft and the linear motor means in a mutually associated relationship similarly as in the case of the guide means of the non-contacting type. In other words, the driving shaft and the linear motor are driven in a mutually associated relationship at such a level that an unstable frictional force and viscous force by the guide means of the contacting type can be ignored, thereby to minimize the vibration producing force of the table to a stopping condition. Consequently, the driving force for the table can be increased while suppressing vibrations of the table, and also a possible displacement of a stopping position from an aimed position can be reduced.

The controlling means controls the driving shaft and the linear motor, for the predetermined period of time before the table is stopped, in a mutually associated condition in accordance with the predetermined driving conditions (deceleration program). For example, while a high deceleration (negative acceleration) which could have not been adopted conventionally due to a high vibration producing force is applied to the table by way of the driving shaft, a driving force which has a frequency equal to a peculiar frequency of the vibration system defined by the resilient force of the driving shaft and the mass of the table and is opposite in phase to the vibration producing force is produced with the linear motor. By the construction, realization of a high deceleration and suppression of vibrations of the table upon stopping can be attained simultaneously. Or else, making use of the fact that the linear motor can be controlled more accurately than the driving shaft, the driving shaft may be driven in the form of mere deceleration while the linear motor is driven to provide an attenuating force which increases in proportion to a current speed of the table, that is, to provide an imitative viscous resistance.

The deceleration program can be determined mathematically or experimentally as a driving force variation characteristic curve of the driving shaft and the linear motor in accordance with a position of the table on the coordinate wherein the origin is an aimed stopping position. Accordingly, such a complicated measuring system or controlling system is not required here as in the case wherein vibrations of the table are detected and fed back to the controlling system for the linear motor every moment.

In the meantime, while the driving force of the driving shaft is reduced to zero upon completion of the deceleration program, the driving force of the linear motor may remain still. Such remaining driving force can be caused to act as a biasing force upon the driving force so that a possible play of the table can be absorbed in one direction.

In order to weave unstable factors such as frictional forces regarding the guide means and the driving shaft into the deceleration program to optimize the deceleration program, it is essential to repeat a driving experiment and a modification of the driving program.

With the stage apparatus of the present invention, a deviation (several μm or so to the utmost) between an actual stopping position of the table and an aimed stopping position after the deceleration program is completed and the table is stopped is absorbed by compulsory movement of the table by the linear motor (whereupon the driving shaft or guide means is resiliently deformed). Here, the first detecting means detects the actual stopping position of the table, and the first modifying means calculates a driving force of the linear motor in accordance with the deviation obtained by subtraction of the measured stopping position from the aimed position and then controls the linear motor to exert the thus calculated driving force. For example, the driving shaft is regarded as a resilient member, and the driving force of the linear motor is increased gradually to cause a resilient deformation corresponding to a desired amount of movement to be produced quasi-statically on the driving shaft.

In the stage apparatus of the present invention, a turning displacement (yawing amount) of the posture of the table in a stopped condition is absorbed by compulsory rotation of the table by means of two linear motors (whereupon the driving shaft or guide means is resiliently bent). Here, the second detecting means drives the two linear motors in the opposite directions to each other in accordance with a yawing amount of the table.

With the stage apparatus of the present invention, since vibration components produced on the driving shaft are suppressed or attenuated by the linear motors whether the guide means is of the contacting type or of the non-contacting type, a very high deceleration by the driving shaft can be achieved without paying attention to production of vibrations. Consequently, the decelerating period and the attenuation waiting time after stopping are decreased and also the accuracy of the stopping position is improved. Further, since simplified control of a high reproducibility by the driving shaft and the linear motor can be made without relying upon an unstable frictional force or attenuating force of the guide means, suppression of vibrations upon stopping of the table can be performed efficiently with a high degree of reliability. Further, since control of the driving shaft and the linear motor is required to respond only to a positional coordinate value or the like obtained by means of, for example, an interferometer and a complicated vibration detecting meter or feedback system is not included, a high speed operation of the stage apparatus is facilitated, and besides, the number of components of the stage apparatus is decreased and the assembling operation is simplified.

Further, the stage which is held in position by the driving shaft having a sufficient rigidity is more rapid in attenuation of vibrations and higher in position holding force at a stopping position than an alternative stage which is driven only with the linear motor.

With the stage apparatus of the present invention, modification of a position deviation by fine feeding and yawing correction by fine rotation can be achieved without increasing components of the table. Accordingly, since the structure of the table remains simple and is not increased in weight, no bad influence is had on the responsibility of the table to the driving force of the driving shaft nor on the positioning accuracy. Thus, a possible remaining error in stopping position can be corrected readily with a high degree of accuracy and without production of unnecessary vibrations of the stage without obstructing an attenuation of vibrations which can be obtained with the stage apparatus of the present invention.

The above and other objects, features and advantages of the present invention will become apparent from the following description and the appended claims, taken in conjunction with the accompanying drawings which show a preferred embodiment of the present invention which is not intended, however, to restrict the present invention.

BRIEF DESCRIPTION OF THE DRAWINGS

FIG. 3 is a block diagram of a controlling system of the stage apparatus of the first embodiment;

DESCRIPTION OF THE PREFERRED EMBODIMENTS

Figure 1:
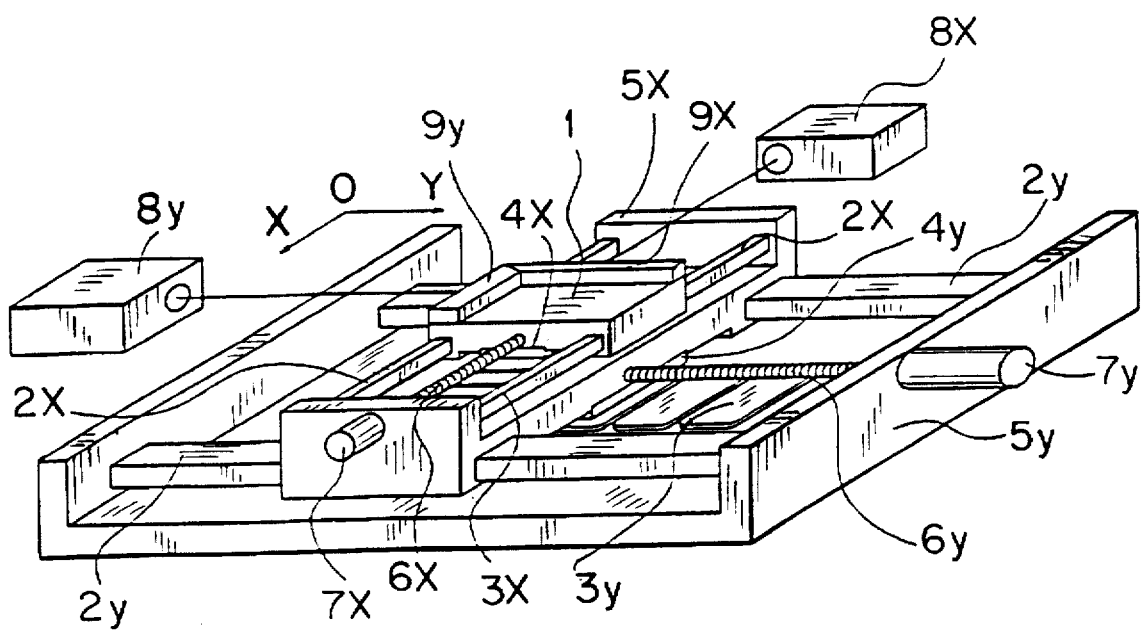
FIG. 1 is a perspective view of a stage apparatus according to a first embodiment of the present invention.

FIG. 1 is a perspective view of a stage apparatus of a first embodiment of the present invention. The stage apparatus is formed as a combination stage apparatus which includes a combination of a stage apparatus mounted for movement in the direction of an x-axis and another stage apparatus mounted for movement in the direction of a y-axis so that it is movable in any direction in a horizontal plane. Accordingly, since they have substantially similar constructions to an X-table mechanism (2x-9x) for driving a table 1 to move in an X direction and a Y table mechanism (2y-9y) for driving the table 1 to move in a Y direction, respectively, description will be given only of the X-table mechanism (2x-9x) particularly shown in FIG. 2.

Figure 2:
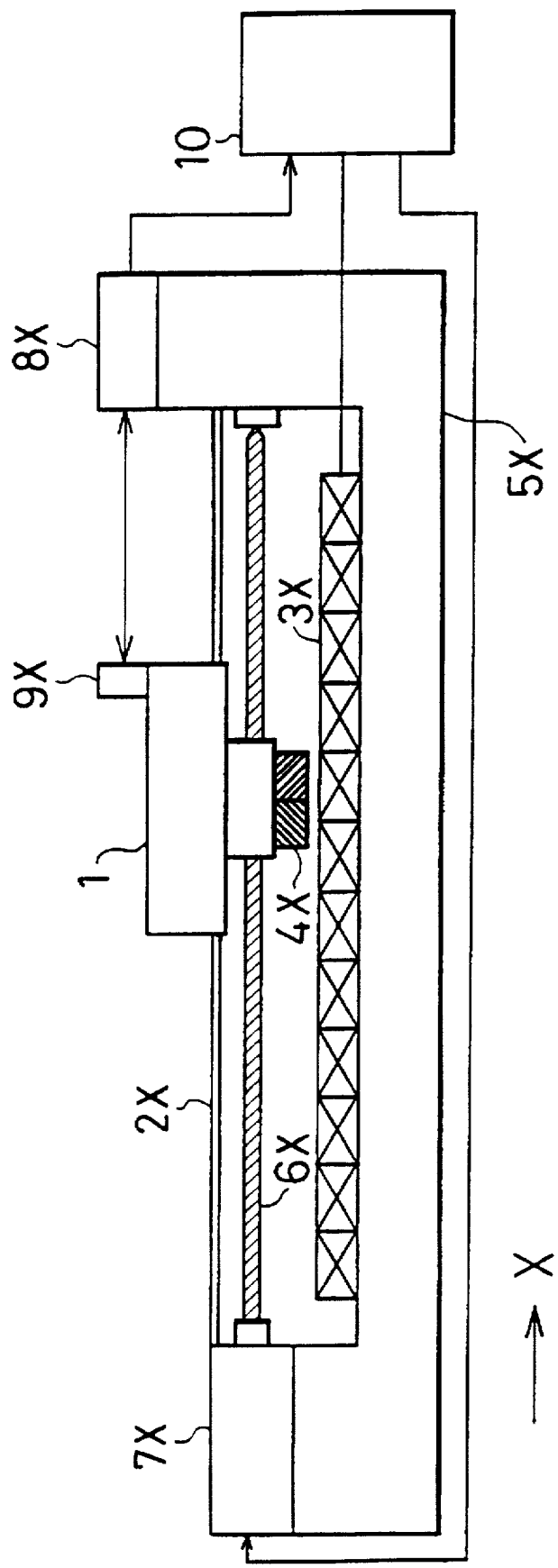
FIG. 2 is a side elevational view schematically showing construction of an x-table mechanism of the stage apparatus of the first embodiment.

FIG. 2 shows an x-table mechanism of the stage apparatus according to the first embodiment of the present invention. Referring to FIG. 2, a table 1 is supported on and guided by a guide mechanism (air bearing or the like) 2x of the non-contacting type and is fed in the X direction or in the opposite direction by a linear motor (a stator 3x and a movable element 4x) and a feed screw 6x. The feed screw 6x is supported for rotation by means of bearings on a base 5x, and a main nut (female thread block) secured to a lower portion of the table 1 is held in meshing engagement with the feed screw 6x. The linear motor includes a stator 3x secured to the base 5x side and a movable element 4x secured to the table 1 side.

The feed screw 6x and the linear motor (3x, 4x) are controlled by a controller 10 in accordance with predetermined driving conditions (program) which are determined in advance in such a mutual relationship as described hereinbelow in order to suppress vibrations of the table 1 upon stopping. After such stopping, the controller 10 urges the table 1 by means of the linear motor (3x, 4x) to extend or contract the feed screw 6x within its resilient range to correct an error amount (difference $\Delta x$) between an aimed position and a stopping position measured by means of an interferometer 8x.

In FIG. 2, the table 1 is supported for linear movement in the X direction by the air bearing 2x and is fed indirectly by a motor 7x by way of the feed screw 6x extending in parallel to the passage provided by the air bearing 2x and also directly by the linear motor (3x, 4x). Here, the linear motor (3x, 4x) is composed of the movable element 4x on the table 1 side and the stator 3x on the base 5x side, and an advancing magnetic field is generated on the stator 3x side to feed the table 1. On the other hand, a coordinate axis x for feeding the table 1 is set on the base 5x, and a position x of the table 1 on the coordinate axis x is measured accurately every moment by means of the laser interferometer 8x on the base 5x side and a reflector (flat mirror) 9x provided at an end portion of the table 1 and serving as a movable mirror. The controller 10 thus operates the motor 7x and the linear motor (3x, 4x) in accordance with a predetermined program in response to results of measurement of the laser interferometer 8x to feed the table 1.

The controller 10 executes a positioning operation of the table 1 such that the table 1 is first accelerated to move toward a stopping aimed position $x_0$ of the table 1 determined on the coordinate axis x and is then moved at a uniform speed, whereafter it is decelerated to stop so that a current position x measured by the interferometer 8x may coincide with the preset aimed position $x_0$. In this instance, the controller 10 operates the linear motor (3x, 4x) and the motor 7x in a mutually associated relationship. By such control, such a positioning and stopping operation is realized wherein remaining vibrations produced on the feed screw 6x by deceleration are cancelled or attenuated before the table 1 is stopped and the stopping position of the table 1 is very close to the aimed position $x_0$ and besides vibrations of the table upon stopping are minimized. It is to be noted that, in the first embodiment described above, operation of the linear motor (3x, 4x) in accordance with the program is performed only for last several minutes of the deceleration period, but in the remaining periods for starting, acceleration and uniform speed movement of the table 1, the table 1 is fed by the motor 7x.

It is to be noted that, if the linear motor (3x, 4x) is operated for periods for acceleration, uniform speed movement and so forth of the table 1, then a higher driving torque can be obtained and consequently, a higher speed operation of the stage 1 can naturally be realized.

On the other hand, after the feed screw 6x stops, the stage position is compensated in the following manner: while maintaining the standing position of the feed screw 6x, the linear motor (3x, 4x) is driven to impart a force upon table 1 which causes the feed screw 6x to be elastically deformed. As a result, the position of table 1 is displaced into another position. The difference (the distance between the positions before and after the movement) is measured by the interferometer 8x. The values measured by the interferometer 8x are compared with that memorized in the controller 10. When the two values are identical, the linear motor (3x, 4x) stops driving.

FIG. 3 is a block diagram of a controlling system of the stage apparatus of the first embodiment. The controller (host computer) 10 described hereinabove controls the entire system including the stage apparatus of the construction described above. Various parameters (constants), data and so forth necessary for positioning operation of the table 1 and also for various calculations are stored in a memory 11. As seen in FIG. 3, the host computer 10 outputs an aimed stopping position $x_0$ of the table 1 stored in the memory 11 to a feed screw controller 12 and a linear motor controller 13.

The feed screw controller 12 and the linear motor controller 13 both receive position information of the table 1 measured by the laser interferometer 8x and calculate respective moving speed instruction values for the table 1 from a difference between the current position $x_1$ of the table 1 and the aimed position $x_0$, whereafter they output the thus calculated moving speed instruction values to compensating circuits (analog controlling circuits) 15a and 15b by way of digital to analog converters 14a and 14b, respectively. Then, the controllers 12 and 13 produce optimum feedback gain controlling signals (which will be hereinafter described) in response to the position and moving speeds of the table 1, and the thus produced optimum feedback gain controlling signals are forwarded to the compensating circuits 15a and 15b. At the compensating circuits 15a and 15b, control amounts for the servomotor 7x and the linear motor (3x, 4x) are calculated by predetermined analog calculations from the moving speed instruction values for the table 1, the feedback gain controlling signals and speed information from a pair of speed detectors (tachometer generators or the like) 16 and 17. The thus calculated values (control instructions) are outputted to the motor 7x and the linear motor (3x, 4x) by way of a pair of power amplifiers 18a and 18b, respectively. As a result, when the table 1 is to be stopped, the motor 7x and the linear motor (3x, 4x) are operated in a mutually associated relationship. It is to be noted that the construction of the controlling system shown in FIG. 3 is a mere example at all, and naturally a controlling system suitable for the stage apparatus according to the first embodiment is not limited to the construction described above.

Though not shown in either of FIGS. 1 and 2, the driving mechanism which employs the feed screw 6x includes the main nut screwed on the feed screw 6x and coupled for integral movement to the table 1, and a sub nut screwed on the feed screw 6x in a spaced relationship by a predetermined distance from the main nut and coupled to the main nut by way of a resilient member (leaf spring or the like). The main nut and the sub nut are associated with each other by the resilient member such that they may not rotate relative to each other, and the resilient member provides a fixed pressure in one direction along an axis of the feed screw 6x between the main nut and the sub nut thereby to provide a fixed contacting force between the feed screw 6x and each of the main nut and the sub nut screwed on the feed screw 6x to prevent such a possible phenomenon which may occur upon stopping of the table 1 that the table 1 is moved back (backlash or the like). Accordingly, when the error amount between a stopping position and an aimed stopping position of the table 1 is to be corrected, if a gap (for example, of several μm or so) is produced, when an urging force is applied to the table 1 by the linear motor (3x, 4x), between the screw 6x and the main nut screwed on the feed screw 6x in accordance with the urging direction by the resilient member and the direction of inertial force acting upon the table 1, then precise positioning of the table 1 can be achieved even if the feed screw 6x is resiliently deformed in the axial direction as described above.

In this instance, if the table 1 is moved in the direction opposite to the urging direction in which the main nut is urged by the resilient member, then a phenomenon that the table 1 is moved back by an amount provided by the gap (backlash or the like) may appear at the same time as stopping of the table 1. However, also in this instance, if an urging force is applied to the table 1 by the linear motor (3x, 4x) after the table 1 is stopped as described hereinabove, then possible deterioration in positioning accuracy of the table 1 by the phenomenon described above can be prevented. Or otherwise, even if such an urging force as will cancel the inertial force mentioned hereinabove is applied, upon stopping of the table 1, to the table 1 using the linear motor (3x, 4x), possible deterioration in positioning accuracy can be prevented similarly.

With the stage apparatus of the construction described above, when the table 1 is moved, a so-called yawing wherein the table 1 is turned with respect to the rectangular coordinate system XY may be produced. Thus, for example, a pair of linear motors are disposed in a substantially parallel, predetermined spaced relationship from each other along the direction of movement (X direction) of the table 1 while a differential interferometer which can measure a yawing amount (turning amount) of the table 1 is provided. Then, if the controller 10 controls the two linear motors to generate, after stopping of the table 1, urging forces for the table 1 in the opposite directions to each other in response to a yawing amount of the table 1 measured by the differential interferometer, then the yawing amount of the table 1 can be reduced almost to zero, and consequently, possible occurrence of a two-dimensional positioning error caused by yawing of the table 1 can be prevented.

By the way, the stopping program for the minimization of vibrations upon stopping provides driving curves in accordance with a distance to the aimed stopping position $x_0$ of the motor 7x and the linear motor (3x, 4x) and is represented as expressions which provide driving conditions of the motor 7x and the linear motor (3x, 4x) in response to a position x of the table 1 with respect to the aimed stopping position $x_0$. The expressions are determined mathematically from action functions of the motor 7x and the linear motor (3x, 4x) upon the table 1 and an equation of motion of the table 1. Actually, it is desirable to repetitively perform experiments with several constants in the expressions to achieve optimization.

The stage apparatus of the first embodiment performs driving of the linear motor (3x, 4x) and driving of the motor 7x in a parallel relationship to each other, and such driving conditions will be described with reference to expressions below. Reference characters used in the following description are such as follows:

m: mass of the table $x_0$: aimed stopping position of the table

X: current position of the table

J: moment of inertia of the rotary shaft (feed screw and motor)

$k_w$: torsional spring constant of the rotary shaft k: spring constant of the rotary shaft C: coefficient of viscosity of the rotary shaft A: rotational amount to linear movement amount converting coefficient of the rotary shaft $\theta_1$: motor side rotational angle of the rotary shaft $\theta_2$: nut side rotational angle of the rotary shaft t: output torque of the motor f: thrust of the linear motor $\lambda_1$: speed feedback gain of the motor $\kappa_1$: position feedback gain of the motor $\lambda_2$: speed feedback gain of the linear motor $\kappa_2$: position feedback gain of the linear motor First, in order to adjust the motion impedance (viscosity and rigidity) of the table, the motor output torque t and the linear motor thrust f are set in the following manner:

$$t = -\lambda_1 \frac{d\theta_1}{dt} + \kappa_1(x_0 - x) \quad (1)$$

$$f = -\lambda_2 \frac{dx}{dt} + \kappa_2(x_0 - x) \quad (2)$$

Meanwhile, an equation of motion of the rotary shaft is provided by $$J \frac{d^2\theta_1}{dt^2} + C \frac{d\theta_1}{dt} + k_w(\theta_1 - \theta_2) = t \quad (2)$$

and an equation of motion of the table is provided by $$m \frac{d^2x}{dt^2} + k(x - A\theta_2) = f \quad (4)$$

Further, from a relationship between x and $\theta_2$, $$k_w(\theta_2 - \theta_1) = -A\, k\, (A\, \theta_2 - x) \quad (5)$$

From the expressions (1) to (5) above, $$J \frac{d^2\theta_1}{dt^2} + (C - \lambda_1) \frac{d\theta_1}{dt} + A^2 \kappa_0 \theta_1 + (\kappa_1 - A\kappa_0)x = \kappa_1 x_0 \quad (6)$$

$$-A\kappa_0 \theta_1 + m \frac{d^2x}{dt^2} + \lambda_2 \frac{dx}{dt} + (\kappa_0 + \kappa_2)x = \kappa_2 x_0 \quad (7)$$

where the constant $\kappa_0$ is determined by $$\kappa_0 = \frac{k \cdot k_w}{(k_w + A^2 k)}$$

A transfer function of the system which receives an input of $x_0$ and develops an output x is obtained from the simultaneous differential equations of the expressions (6) and (7) as $$x = \frac{b_2 s^2 + b_1 s + b_0}{a_4 s^4 + a_3 s^3 + a_2 s^2 + a_1 s^1 + a_0} x_0$$

where $a_0 = (\kappa_1 + A\, \kappa_2)A\, \kappa_0$ $a_1 = (\kappa_0 + \kappa_2)(C + \lambda_1) + \lambda_2 A^2 \kappa_0$ $a_2 = (\kappa_0 + \kappa_2)J + A^2 \kappa_0 m + \lambda_2(C + \lambda_1)$ $a_3 = (C + \lambda_1)m + \lambda_2 J$ $a_4 = m\, J$ $b_0 = a_0$ $b_1 = \kappa_2(C+\lambda)$ $b_2 = \kappa_2 J$ The parameters $a_0$ to $a_4$ and $b_1$ to $b_2$ will be described subsequently.

The parameter $a_0$ represents an influence of a position feedback of the motor and the linear motor which compensates for the rigidity of the system.

The parameter $a_1$ represents an influence of a sum of a viscosity term of the rotary shaft system, a speed feedback of the motor which compensates for the viscosity term and a speed feedback of the linear motor which compensates for a viscosity term of the table.

The parameter $a_2$ represents an influence of a sum of inertial terms of the rotary shaft system and the table and another sum of feedbacks of the position and the speed of the linear motor which compensate for the inertial terms.

The parameter $a_3$ represents an influence of a product of the inertial term of the table and the viscosity term of the rotary shaft system and a sum of the speed feedbacks of the linear motor and the motor which compensate for the inertial term and the viscosity term.

The parameter $a_4$ represents a product of the inertial term of the table and the inertial term of the rotary shaft system.

The parameter $b_1$ represents an influence of the position feedback of the linear motor which compensates for a delay in phase by the viscosity term.

The parameter $b_2$ represents an influence of the position feedback of the linear motor which compensates for a delay in phase by the inertial term.

Accordingly, if expressions of a state space model are determined using the parameters $a_0$ to $a_4$ and $b_1$ to $b_2$, then they are represented in the following manner. It is to be noted that $Z$ is a state variable.

$$\dot{Z} = A \cdot Z + B \cdot x_0 \quad (9)$$

$$x = C \cdot Z \quad (10)$$

$$A = \begin{bmatrix} 0 & 1 & 0 & 0 \\ 0 & 0 & 1 & 0 \\ 0 & 0 & 0 & 1 \\ -a_0/a_4 & -a_1/a_4 & -a_2/a_4 & -a_3/a_4 \end{bmatrix}$$

$$B = \begin{bmatrix} 0 \\ 0 \\ 0 \\ 1/a_4 \end{bmatrix}$$

$$C = [b_0 \ b_1 \ b_2 \ 0]$$

$$Z \begin{bmatrix} z \\ \dot{z} \\ \ddot{z} \\ \dddot{z} \end{bmatrix}$$

Accordingly, the parameters can be set to individual values desirable for feeding of the motor by suitably adjusting the feedback gains $\lambda_1$, $\lambda_2$, $\kappa_1$, and $\kappa_2$ of the expressions (4) and (5) above. Although the feedback gains may otherwise be fixed, positioning with a higher degree of accuracy can be achieved by adjusting the gains every moment by means of an optimum regulator or by linear control or the like.

Further, since the stage apparatus of the first embodiment employs an air bearing as the guide means for the table 1, management of lubricating oil which is required in conventional arrangements is unnecessary, and high speed movement is facilitated due to absence of friction.

Figure 4:
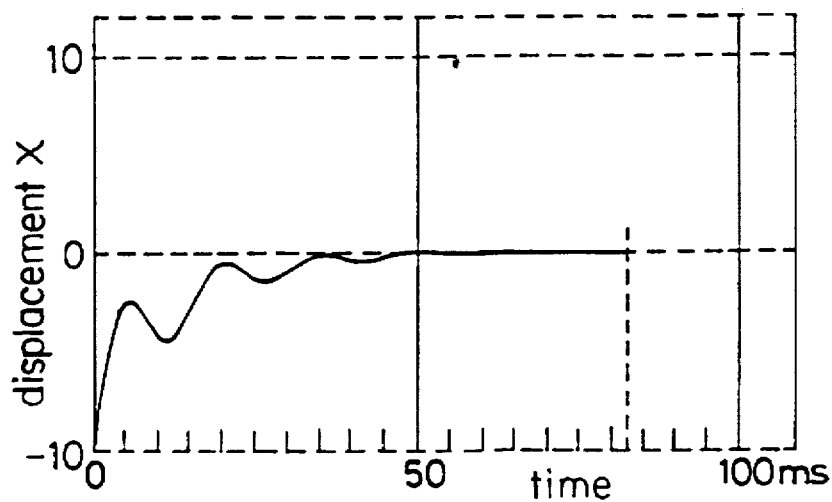
FIGS. 4, 5 and 6 are diagrams illustrating operation of the stage apparatus of the first embodiment.
Figure 5:
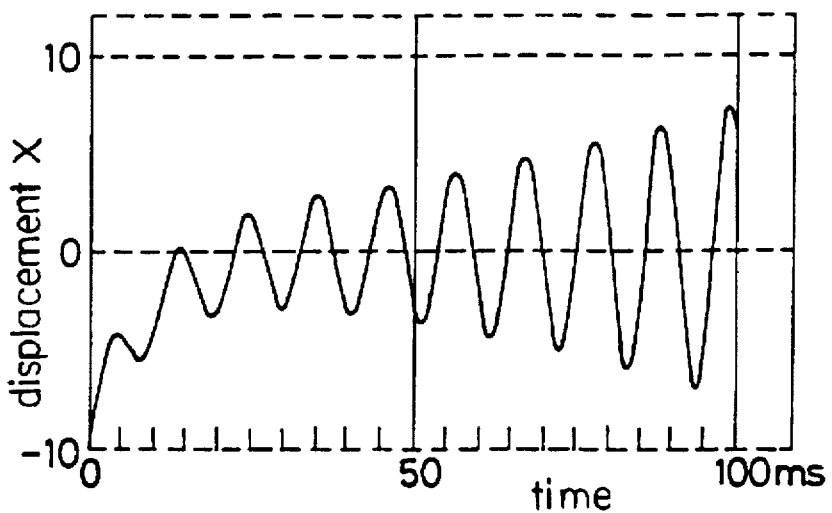
Figure 6:
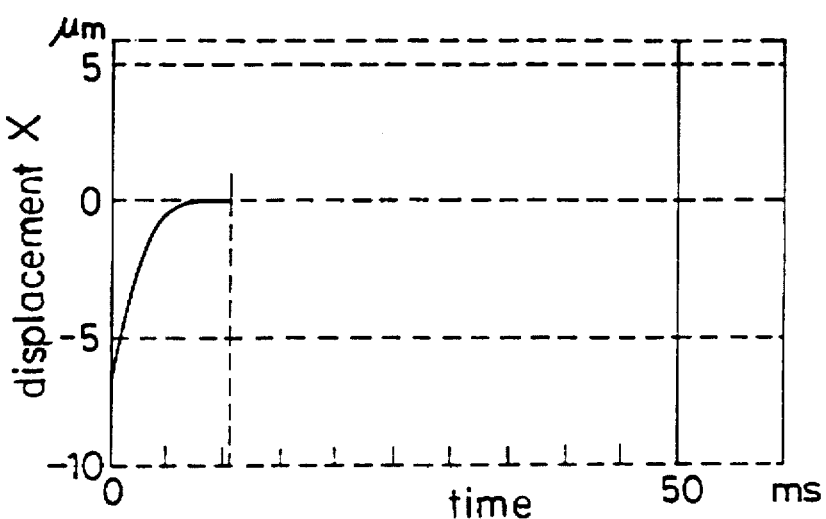
Figure 7:
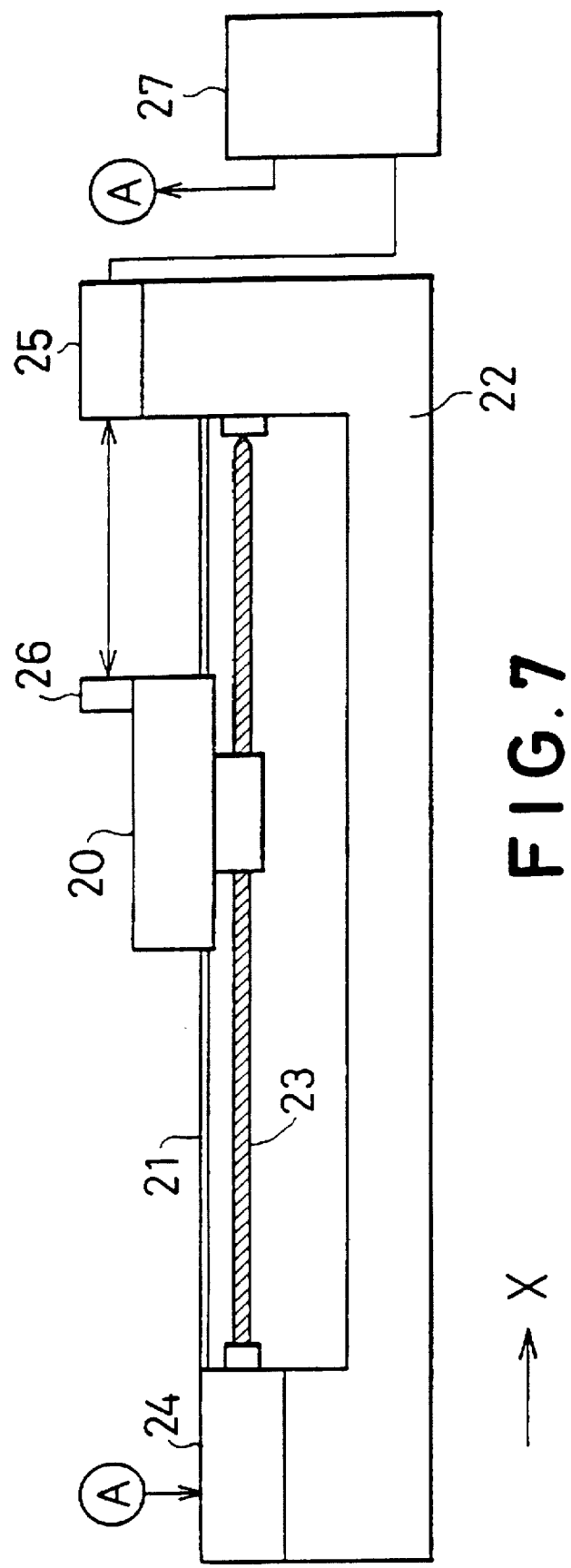
FIG. 7 is a side elevational view schematically showing structure of a conventional stage apparatus.

FIGS. 4 to 6 show results of experiments wherein, using the space model of the expressions (9) and (10) above, the feedback gains of the motor 7x and the linear motor (3x, 4x) of the stage apparatus of the first embodiment are varied to investigate vibration attenuating effects in the X direction upon stopping of the table 1. Here, the table 1 performs uniform speed movement for each 2 mm seconds to a position spaced by 10 μm to the aimed stopping position $x_0$ and then executes position feedback control while adjusting the motion impedances of the motor 7x and the linear motor (3x, 4x) in accordance with the expressions (1) and (2) given hereinabove.

FIG. 4 shows a result of an experiment wherein the table 1 is fed only by way of the feed screw 6x while executing position feedback to the motor 7x without using the linear motor (3x, 4x). From the graph, it can be seen that, due to remaining vibrations, 82.5 msec or so is required until the position of the table 1 comes within the positioning error of 0.01 μm or less.

FIG. 5 shows a result of an experiment wherein the feedback is increased in the same conditions as in the case of FIG. 4.

The table 1 begins to resonate. Where the table 1 is supported in a non-contacting condition and is fed only by way of the feed screw 6x in this manner, since the rigidity and viscosity are insufficient, a high feedback gain cannot be adopted, and accordingly, it can be seen that high speed, high accuracy positioning is difficult.

FIG. 6 shows a result of an experiment wherein the motion impedance of the driving system is adjusted by the linear motor (3x, 4x). The motion of the table 1 converges in 11 msec without an overshoot. In this manner, the linear motor makes the motion impedance of the table 1 appropriate to enable stable feedback control of a high gain of the servomotor 7x. It is to be noted that, while in the embodiment described above the present invention is applied to an X-Y stage, it is apparent that similar effects can be obtained where the present invention is applied to any apparatus which is moved linearly (in a one-dimensional condition).

While in the first embodiment the guide means is of the non-contacting type employing an air bearing or the like to eliminate a possible influence of the guide means upon motion of the table, guide means of the contacting type such as a needle bearing can otherwise be employed. Description will be given subsequently of a second embodiment which employs guide means of such contacting type.

Generally, friction exists in guide means of the contacting type. Consequently, position of a table normally involves a positioning error as a steady-state deviation. In order to reduce such positioning error, such a countermeasure is required to increase the gain of a controlling system or to insert an integrating compensator. However, in order to keep the positioning error on the sub-micron order, a sufficient driving force to overcome the frictional force is required, but since guide means of the contacting type does not present a sufficient viscosity, there is a tendency that a table vibrates. Accordingly, also with a stage apparatus which adopts guide means of the contacting type such as a needle bearing, an effective decelerating program wherein a feed screw and a linear motor are controlled in a mutually associated relationship can be executed similarly as in the first embodiment.

The stage apparatus of the second embodiment is a modification to the stage apparatus of the first embodiment of FIG. 2 in that the guide means 2x in the first embodiment is replaced by guide means of the contacting type which includes a plurality of needle bearings arranged in a row. Accordingly, description of detailed construction of the stage apparatus of the second embodiment will be omitted herein.

Figure 8:
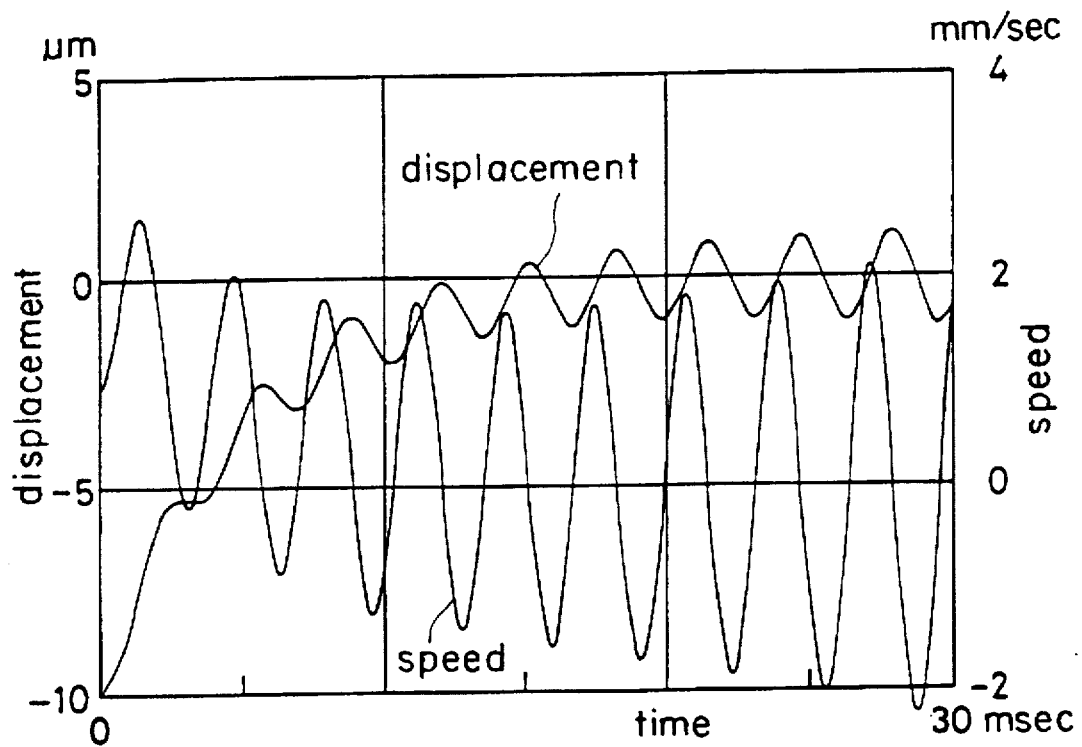
FIGS. 8, 9 and 10 are diagrams illustrating operation of a stage apparatus according to a second embodiment of the present invention.
Figure 9:
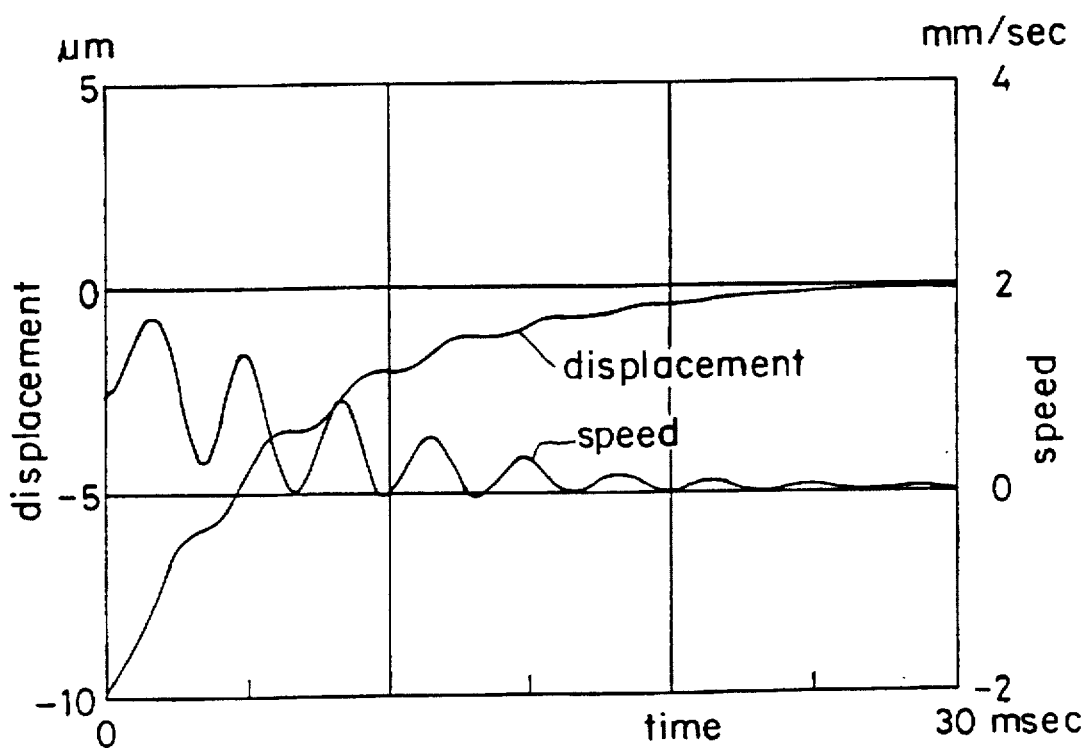
Figure 10:
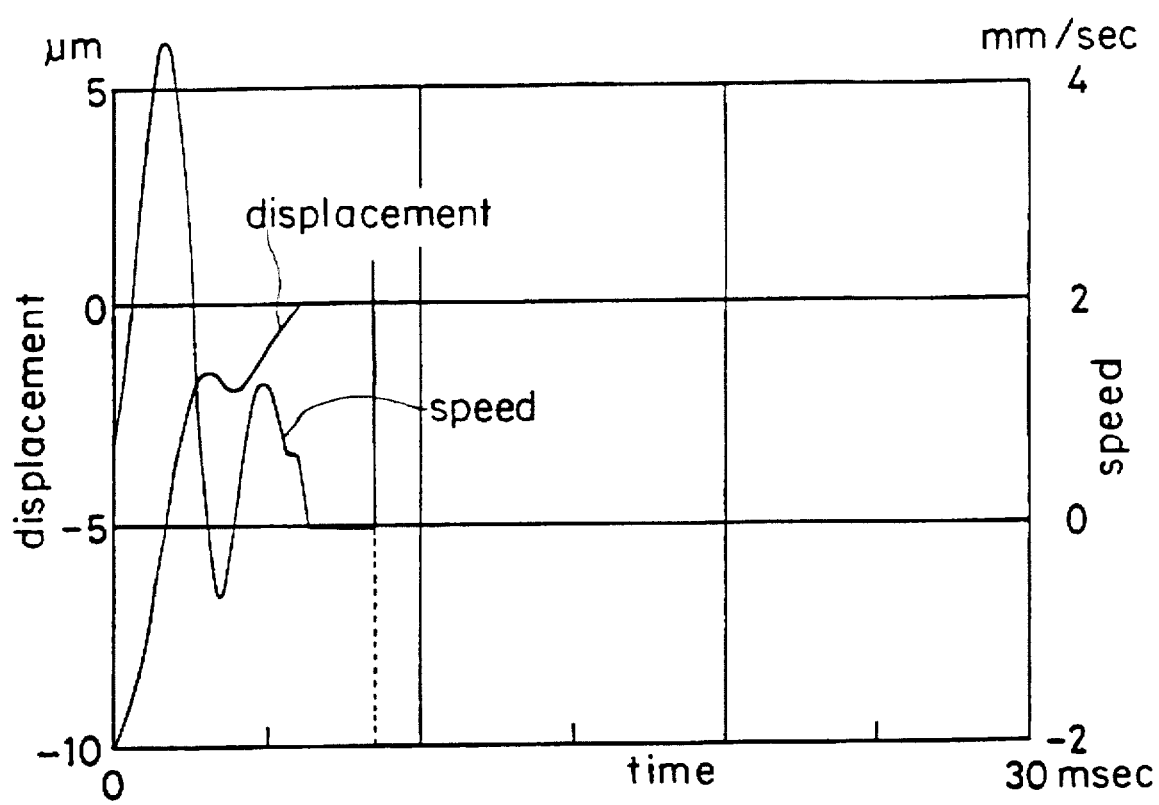

FIGS. 8 to 10 are provided to illustrate an effect of suppressing vibrations of the table of the stage apparatus of the second embodiment and show variations of the speed and position of the table at every moment when various controls are executed toward an aimed position. FIG. 8 is a diagram when small gain control is executed using only the feed screw; FIG. 9 is a diagram when gain control is executed using only the feed screw; and FIG. 10 is a diagram when the feed screw and the linear motor are operated in a mutually associated relationship.

As apparently seen from FIG. 8, in case small gain control is executed toward an aimed position only by way of the feed screw, the frictional force of the guide means prevails, and consequently, the motion of the table is not vibratory, but when the table is stopped, a steady-stage deviation of 0.2 μm takes place and a period of time of 30 msec is required till stopping from a speed of almost 2 mm/sec.

As apparently seen from FIG. 9, in case high gain control is executed toward an aimed position only by way of the feed screw, an equivalent condition takes place to that wherein the guide means presents no frictional force nor attenuating force, and the motion of the table is vibratory and exhibits an oscillating condition. Consequently, the table will not be stopped indefinitely.

As apparently seen from FIG. 10, in case the feed screw and the linear motor are operated in a mutually associated condition toward an aimed position, that is, in case the motion impedance of the stage apparatus is adjusted suitably similarly as in the case of the first embodiment, even if a very high driving force is provided to the feed screw, since the linear motor adjusts the motion impedance such as a viscosity, a very high responsibility is obtained and also the steady-stage deviation is kept sufficiently on the sub-micron order without depending upon a frictional force or an attenuating force of the guide means.

What is claimed is:

1. A stage apparatus comprising:
   a table;
   a base and guide mechanism for supporting movement of said table in a first direction;
   a first driving mechanism on said base for driving said table in said first direction; said first driving mechanism including a driving shaft aligned in said first direction and being affixed to said table;
   a second driving mechanism comprising a movable element fixed with respect to said table and having at least one stator mounted on said base so as to face said movable element in parallel alignment with said first direction wherein said second driving mechanism operates by the magnetic force developed from said stator on said movable element; and
   a control device comprising at least a first operating mode for driving table under the control of said first driving mechanism and a second operating mode for stopping the movement of said table under the control of said first driving mechanism and said second driving mechanism.

2. A stage apparatus according to claim 1, wherein said control device comprises:
   a first controller for controlling the movement of said table through said first driving mechanism; and
   a second controller for controlling the movement of said table through said second driving mechanism via said movable element; and
   a main controller to correlate the operations of said first controller and said second controller.

3. A stage apparatus according to claim 2, wherein said main controller supplies positioning data to identify an aimed stop position for said first and second controllers; wherein said first controller controls said first driving mechanism until said table reaches the aimed stop position according to positioning data from said main controller and wherein said second controller controls said second driving mechanism according to positioning data from said main controller during deceleration of said table.

4. A stage apparatus according to claim 2, wherein said main controller additionally comprises:
   a detector that measures the position of said table on said base; and
   a compensating circuit that controls said second driving mechanisms in response to the difference between an aimed stop position for the table and the stop position measured by said detector for forcibly minimizing said difference by the driving force of said second driving mechanism.

5. A stage apparatus according to claim 1, wherein said driving shaft comprises a feed screw mechanism; wherein said feed screw mechanism comprises a feed screw supported by a bearing on said base, and a female screw block affixed said table with threads which match the feed screw; and wherein the movable elements of said second driving mechanism are placed on said female screw block.

6. A stage apparatus comprising:
   a movable table;
   a base that movably supports a guide mechanism connected to said table for controlling movement of said table in a first direction;
   a first driving mechanism for driving said table, said first driving mechanism including a driving shaft aligned in said first direction on said base and being affixed to said table;
   a second driving mechanism comprising a movable element unit fixed with respect to said table and having a stator unit mounted on said base and being collinearly aligned along said movable element unit in said first direction, wherein said second driving mechanism operates by the magnetic force developed from said fixed element unit on said movable element unit; and
   a control device comprising at least a first operating mode for driving said table under the control of said first driving mechanism and a second operating mode for stopping the movement of said table under the control of said first driving mechanism and said second driving mechanism.

7. A stage apparatus comprising:
   a movable table;
   a base and a guide mechanism assembly for supporting movement of said movable table in a first direction;
   a contact type driving mechanism, for driving said movable table in the first direction by making mechanical contact between said movable table and said base;
   a non-contacting type driving mechanism that comprises a movable member fixed to said movable table and a stator member collinearly along the first direction on said base and coupled magnetically to said movable member without mechanical contact, for generating a decelerating force upon said movable table along said first direction; and
   a control device to actuate at least said contact type driving mechanism when said movable table is accelerating and to actuate said noncontacting type driving mechanism at least when said movable table is decelerating.

8. A stage apparatus according to claim 7, wherein said noncontacting type driving mechanism includes a linear motor system having said movable member and said stator member, and said control device includes a linear motor controller for executing an effective decelerating program to drive said linear motor system so as to be controlled in a mutually associated relationship with said contact type driving mechanism.

9. A stage apparatus according to claim 8, wherein said linear motor system includes a first linear motor and a second linear motor disposed each side of said contact type driving mechanism, said linear motor controller actuates said first and second linear motors independently to reduce a yawing error of said movable table.

10. A stage apparatus according to claim 7, said control device further actuates said noncontacting type driving mechanism after the stopping of the movement of said movable table in order to correct a positional deviation error caused by the positioning operation with said contact type driving mechanism.

11. A stage apparatus according to claim 7, said control device further actuates said noncontacting type driving mechanism during the acceleration period of said movable table by said contact type driving mechanism in order to obtain a higher speed operation of said movable table.

* * * * *